(12) United States Patent
Doany et al.

(10) Patent No.: US 9,671,563 B2
(45) Date of Patent: *Jun. 6, 2017

(54) THROUGH-SUBSTRATE OPTICAL COUPLING TO PHOTONICS CHIPS

(71) Applicant: International Business Machines Corporation, Armonk, NY (US)

(72) Inventors: Fuad Doany, Katonah, NY (US); Benjamin G. Lee, New York, NY (US); Clint L. Schow, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/069,532

(22) Filed: Mar. 14, 2016

(65) Prior Publication Data

US 2016/0195678 A1 Jul. 7, 2016

Related U.S. Application Data

(63) Continuation of application No. 13/370,886, filed on Feb. 10, 2012, now Pat. No. 9,285,554.

(51) Int. Cl.
*G02B 6/30* (2006.01)
*G02B 6/42* (2006.01)
(Continued)

(52) U.S. Cl.
CPC .......... *G02B 6/30* (2013.01); *G02B 6/12002* (2013.01); *G02B 6/124* (2013.01); *G02B 6/136* (2013.01);
(Continued)

(58) Field of Classification Search
CPC ...... G02B 6/34; G02B 6/12004; G02B 6/124; G02B 6/4214; G02B 6/43; G02B 6/12; G02B 6/305; G02B 6/30; G02B 6/13
See application file for complete search history.

(56) References Cited

U.S. PATENT DOCUMENTS

| 4,935,939 A | 6/1990 | Liau et al. |
| 5,195,150 A | 3/1993 | Stegmueller et al. |

(Continued)

OTHER PUBLICATIONS

Dillon et al., "Micromachining of a fiber-to-waveguide coupler using grayscale lithography and through-wafer etch", Micromachining and Microfabrication Process Technology XIII, Proc. of SPIE, vol. 6882, 688206 (2008), downloaded from SPIE Digital Library on Feb. 4, 2011.

(Continued)

*Primary Examiner* — Thomas A Hollweg
*Assistant Examiner* — Mary A El Shammaa
(74) *Attorney, Agent, or Firm* — Scully, Scott, Murphy & Presser, P.C.; Kurt P. Goudy, Esq.

(57) ABSTRACT

An optoelectronic integrated circuit for coupling light to or from an optical waveguide formed in an optical device layer in a near-normal angle to that layer. In an embodiment, the integrated circuit comprises a semiconductor body including a metal-dielectric stack, an optical device layer, a buried oxide layer and a semiconductor substrate arranged in series between first and second opposite sides of the semiconductor body. At least one optical waveguide is formed in the optical device layer for guiding light in a defined plane in that device layer. Diffractive coupling elements are disposed in the optical device layer to couple light from the waveguide toward the second surface of the semiconductor body at a near-normal angle to the defined plane in the optical device layer. In an embodiment, an optical fiber is positioned against the semiconductor body for receiving the light from the coupling elements.

20 Claims, 11 Drawing Sheets

(51) Int. Cl.

| | | |
|---|---|---|
| *G02B 6/124* | (2006.01) | |
| *G02B 6/293* | (2006.01) | |
| *G02B 6/12* | (2006.01) | |
| *G02B 6/136* | (2006.01) | |
| *G02B 6/32* | (2006.01) | |
| *G02B 6/36* | (2006.01) | |
| *H01L 25/16* | (2006.01) | |

(52) U.S. Cl.
CPC ........... *G02B 6/29323* (2013.01); *G02B 6/32* (2013.01); *G02B 6/3652* (2013.01); *G02B 6/4214* (2013.01); *G02B 2006/12104* (2013.01); *H01L 25/167* (2013.01); *H01L 2924/0002* (2013.01)

(56) References Cited

U.S. PATENT DOCUMENTS

| | | | |
|---|---|---|---|
| 6,075,908 | A | 6/2000 | Paniccia et al. |
| 6,888,652 | B2 | 5/2005 | Miyake et al. |
| 6,910,812 | B2 | 6/2005 | Pommer et al. |
| 6,955,934 | B2 | 10/2005 | Gallup et al. |
| 7,128,476 | B1 | 10/2006 | Boudreaux et al. |
| 7,162,124 | B1 | 1/2007 | Gunn, III et al. |
| 7,283,717 | B2 | 10/2007 | Mendoza et al. |
| 7,298,941 | B2 | 11/2007 | Palen et al. |
| 7,352,066 | B2 | 4/2008 | Budd et al. |
| 7,454,102 | B2 | 11/2008 | Keyser et al. |
| 7,556,440 | B2 | 7/2009 | Birincioglu et al. |
| 7,703,993 | B1 | 4/2010 | Darbinyan et al. |
| 2004/0156589 | A1 | 8/2004 | Gunn, III et al. |
| 2006/0177173 | A1 | 8/2006 | Shastri et al. |
| 2009/0263923 | A1 | 10/2009 | Shimooka |
| 2010/0119192 | A1 | 5/2010 | Fujikata et al. |
| 2011/0216997 | A1 | 9/2011 | Gothoskar et al. |

OTHER PUBLICATIONS

Palen, "Optical coupling to monolithic integrated photonic circuits", Photonics Packaging, integration, and interconnects VII, Proc. of SPIE, vol. 6478, 64780K, (2007).

Ade et al., "Direct backside connection of optical fibers to GaAs detectors", SPIE vol. 881, Optical Computing and Nonlinear Materials (1988) pp. 199-203.

FIBER OR WAVEGUIDE ARRAY CONNECTOR WITH ARRAY OF LENS ELEMENTS FOR COUPLING LIGHT FROM GRATING COUPLER TO FIBERS

THROUGH-SUBSTRATE OPTICAL COUPLING TO PHOTONICS CHIPS

CROSS-REFERENCE TO RELATED APPLICATION

This application is a continuation of copending patent application Ser. No. 13/370,886, filed Feb. 10, 2012, the entire contents and disclosure of which are hereby incorporated herein by reference in their entireties.

STATEMENT REGARDING FEDERALLY SPONSORED RESEARCH OR DEVELOPMENT

This invention was made with government support under Contract No. H90011-08-C-0102 (NOBS) (Defense Advanced Research Projects Agency (DARPA)). The government has certain rights in the invention.

BACKGROUND OF THE INVENTION

This invention generally relates to optoelectronic integrated circuits, or photonics chips, and more specifically, to optical coupling between a waveguide and a photonics chip.

Optoelectronic integrated circuits (ICs) include both electronic and optical elements within a single chip. Typical electronic elements include field effect transistors, capacitors, and resistors; and typical optical elements include waveguides, optical filters, modulators, and photodetectors. Within a given optoelectronic IC, some of the electronic elements may be dedicated to handling tasks such as data storage and signal processing. Other electronic elements may be dedicated to controlling or modulating the optical elements. Including both types of elements on a single chip provides several advantages, which include reduced layout area, cost, and operational overhead. In addition, such integration yields hybrid devices, such as an opto-isolator.

The integration of optical and electronic elements has been greatly facilitated by the maturation of today's semiconductor processing techniques. For instance, conventional processing techniques may be adapted to create silicon-based prisms, waveguides, and other optical devices.

One device, however, that has been difficult to integrate is a silicon based laser or light source. As a result, most optoelectronic ICs are adapted to receive an externally applied light beam from a laser or an optical fiber. Unfortunately, introducing a light beam to an IC can often be difficult. For example, in order for an optoelectronic IC to accommodate a light beam, the spot size and the numerical aperture (NA) of the beam may need to be appropriately matched to optical elements within an IC.

Two primary methods for coupling standard single-mode optical fibers to/from high-index contrast photonic platforms are (1) edge coupling based on inverse tapered waveguides, and (2) near-normal coupling based on resonant waveguide gratings. With the former approach, the inverse tapered waveguides (e.g., Si) are evanescently coupled to lower index contrast waveguides (e.g., SiON) with mode-field diameters larger than the high-index-contrast waveguides but still much smaller than those of standard single-mode optical fiber.

This edge coupling approach may suffer from limited real estate available at the chip edge for optical I/O, limited I/O density limited to 1-D fiber arrays, and additional complexity (such as fiber tapers, lenses, etc.) required for interfacing the unmatched mode field diameters at the chip edge and fiber facet. The second approach alleviates many of these problems. First, it allows coupling of 2-D fiber arrays to 2-D layouts of waveguide gratings on the chip surface. Second, it can provide fiber-matched mode-field diameters in well-designed gratings. However, the intrinsic trade-off in the grating couplers between coupling efficiency and bandwidth, as well as a fundamental coupling efficiency limit of less than unity, plagues systems seeking to implement this technology. Additionally, the standard approach of coupling from the top of the photonic device layer is not compatible with CMOS-processing, which includes several layers of metals and dielectrics above the photonic device layer.

In one prior art system, a metal mirror may be introduced above a grating to retransmit the uncoupled light back into the grating a second time for increased efficiency. In this implementation, the optical beam passes through the chip substrate, but the optical properties of the substrate are not leveraged for increased coupling performance. Instead, a complex lensing system is used near a remote fiber facet. Another prior art system implements prisms within and around the substrate to couple light into and out of the photonic waveguides from the bottom side of the chip. However, evanescent coupling schemes, rather than grating-based coupling schemes, are used, which require a costly thinning of the buried oxide layer to less than 250 nm (typically 1 to 3 um).

BRIEF SUMMARY

Embodiments of the invention provide an optoelectronic integrated circuit for coupling light to or from an optical waveguide formed in an optical device layer in a near-normal angle to that layer. In an embodiment, the integrated circuit comprises a semiconductor body including a metal-dielectric stack, an optical device layer, a buried oxide layer and a semiconductor substrate arranged in series between first and second opposite sides of the semiconductor body. At least one optical waveguide is formed in the optical device layer for guiding light in a defined plane in the optical device layer. A plurality of diffractive coupling elements are disposed in the optical device layer to couple light from the waveguide to the second surface of the semiconductor body at a near-normal angle to the defined plane in the optical device layer.

In an embodiment, an array of lenses is formed in the second surface of the semiconductor body to receive light from or to transmit light to the plurality of diffractive coupling elements.

In an embodiment, a metallic reflective layer is formed in the metal-dielectric stack adjacent the diffractive coupling elements to redirect light to the diffractive coupling elements and therein enhance optical coupling efficiency.

In one embodiment, the plurality of diffractive coupling elements comprise a grating patterned into the at least one optical waveguide to allow near-normal light reflection to and from the optical waveguide.

In an embodiment, one or more mechanical elements are fabricated on the second surface of the semiconductor body to facilitate positioning an external optical fiber or optical waveguide on the semiconductor body in a position aligned with the array of lenses.

In one embodiment, one or more grooves are formed in the second surface of the semiconductor body to reflect light from the diffractive coupling elements into a direction substantially parallel with the first and second surfaces of the semiconductor body to an edge of the semiconductor body.

In an embodiment, at least one of said one or more grooves is a V-shaped groove extending into the semiconductor substrate from the second surface of the semiconductor body and aligned with the diffractive coupling elements.

In one embodiment, one or more mechanical elements are fabricated on the semiconductor body to facilitate positioning an external optical fiber or optical waveguide on the semiconductor body in a position aligned to receive the light reflected by said one or more grooves.

Embodiments of the invention provide a method of fabricating an optoelectronic integrated circuit. In an embodiment, the method comprises fabricating a semiconductor body including a metal-dielectric stack, an optical device layer, a buried oxide layer and a semiconductor substrate arranged in series between first and second sides of the semiconductor body. Fabricating this semiconductor body includes forming at least one optical waveguide in the optical device layer for guiding light in a defined plane in the optical device layer, and forming a plurality of diffractive coupling elements in the optical device layer to couple light from the waveguide to the second surface of the semiconductor body at a near-normal angle to said defined plane.

In one embodiment, an array of lenses is formed in the second surface of the semiconductor body to receive light from or to direct light to the plurality of diffractive coupling elements.

In an embodiment, a metallic reflective layer is formed in said metal-dielectric stack adjacent the diffractive coupling elements to redirect light to the diffractive coupling elements and therein enhance optical coupling efficiency.

In one embodiment, the plurality of diffractive coupling elements are formed by patterning a grating into the optical waveguide to allow near-normal light reflection to and from the optical waveguide.

In an embodiment, one or more mechanical elements are fabricated on the second surface of the semiconductor body to facilitate positioning an external optical fiber or optical waveguide against said third side of the semiconductor body in a position aligned to receive the light reflected by said at least one groove.

Embodiments of the invention provide an optoelectronic transceiver module. The module comprises a semiconductor body including a metal-dielectric stack, an optical device layer, a buried oxide layer and a semiconductor substrate arranged in series between first and second sides of the semiconductor body. At least one optical waveguide is formed in the optical device layer for guiding light in a defined plane in the optical device layer. A plurality of diffractive coupling elements are disposed in the optical device layer to direct light from the waveguide toward the second surface of the semiconductor body at a near-normal angle to said defined plane. A fiber array connector is assembled on the semiconductor body, and this connector comprises an array of optical fibers arranged in a plane approximately parallel to the defined plane in the optical device layer for receiving said light from the waveguide.

In one embodiment, the fiber array connector is assembled on the second surface of the semiconductor body, and the fiber array connector includes an array of lenses for focusing the light from the waveguide onto the fiber array.

In an embodiment, the fiber array connector includes mechanical alignment elements for positioning the fiber array connector in a specified position on the semiconductor body.

In one embodiment, the semiconductor body includes an array of lenses formed on the second surface of the semiconductor body to receive light from the plurality of diffractive elements. The mechanical alignment elements position the fiber array connector on the semiconductor body with the array of lenses of the fiber array connector aligned with the array of lenses of the semiconductor body.

In an embodiment, the semiconductor body includes at least one groove formed in the second surface of the semiconductor body to reflect light from the diffractive coupling elements into a direction substantially parallel with the first and second surfaces of the semiconductor body to an edge of the semiconductor body, said edge being on a third side of the semiconductor body, between the first and second sides thereof. The fiber array connector comprises one or more mechanical alignment elements to facilitate positioning the fiber array connector adjacent said edge of the semiconductor body in a position aligned to receive the light reflected by said at least one groove.

Embodiments of the invention provide backside optical coupling from optical waveguides fabricated on the front surface of a photonic chip through the semiconductor substrate. Embodiment of the invention use grating-based near-normal optical coupling schemes disposed on the front waveguide surface in combination with lens elements and alignment features integrated on the back surface of the substrate. In embodiments of the invention, the addition of metal mirrors disposed over the grating structure is used to enhance efficiency. The grating coupler is also compatible with polarization diversity schemes, mode-matching to specific optical fiber mode dimensions, and 2-D fiber array coupling.

Embodiments of the invention can apply to passive photonic circuits, photonic structures implemented with electronics in a monolithic process, and photonic structures implemented with electronics through hybrid integration such as flip-chip or wire bonding. Embodiments of the invention are impervious to these details since these various embodiments all share in common the buried oxide layer beneath the photonic device layer, the substrate beneath the buried oxide, and the availability of metal above the photonic device layer.

DETAILED DESCRIPTION

Embodiments of the invention provide an optical coupling structure that receives a light beam and couples the beam into a waveguide. In a reverse manner, the optical coupling structure may also move light away from the waveguide and out of an optoelectronic IC. The methods of fabricating such an optical structure described below implement a variety of conventional semiconductor processes and combinations thereof, which include: lithography, etching, thin-film deposition, and anti-reflective coatings. Moreover, some of the embodiments also include methods that may employ conventional wafer to wafer attachment/bonding processes.

For simplicity, the description below and related figures describe an optical coupling structure that includes a silicon-based waveguide that consists of single crystalline silicon layer. In alternative embodiments the waveguide may be polycrystalline silicon and it may also comprise multiple layers with specific characteristics for each individual layer (i.e., doping, thickness, resistivity, etc.). The thickness of the waveguide may be tailored to accommodate one or more modes of a propagating light beam. In addition, although the described embodiments below use silicon-based optical elements, other types of high index materials (i.e., gallium arsenide, lithium niobate, indium phosphide, etc.) may replace silicon-based elements. Further, the waveguide and coupling regions may take on a variety of shapes and sizes.

Figure 1:
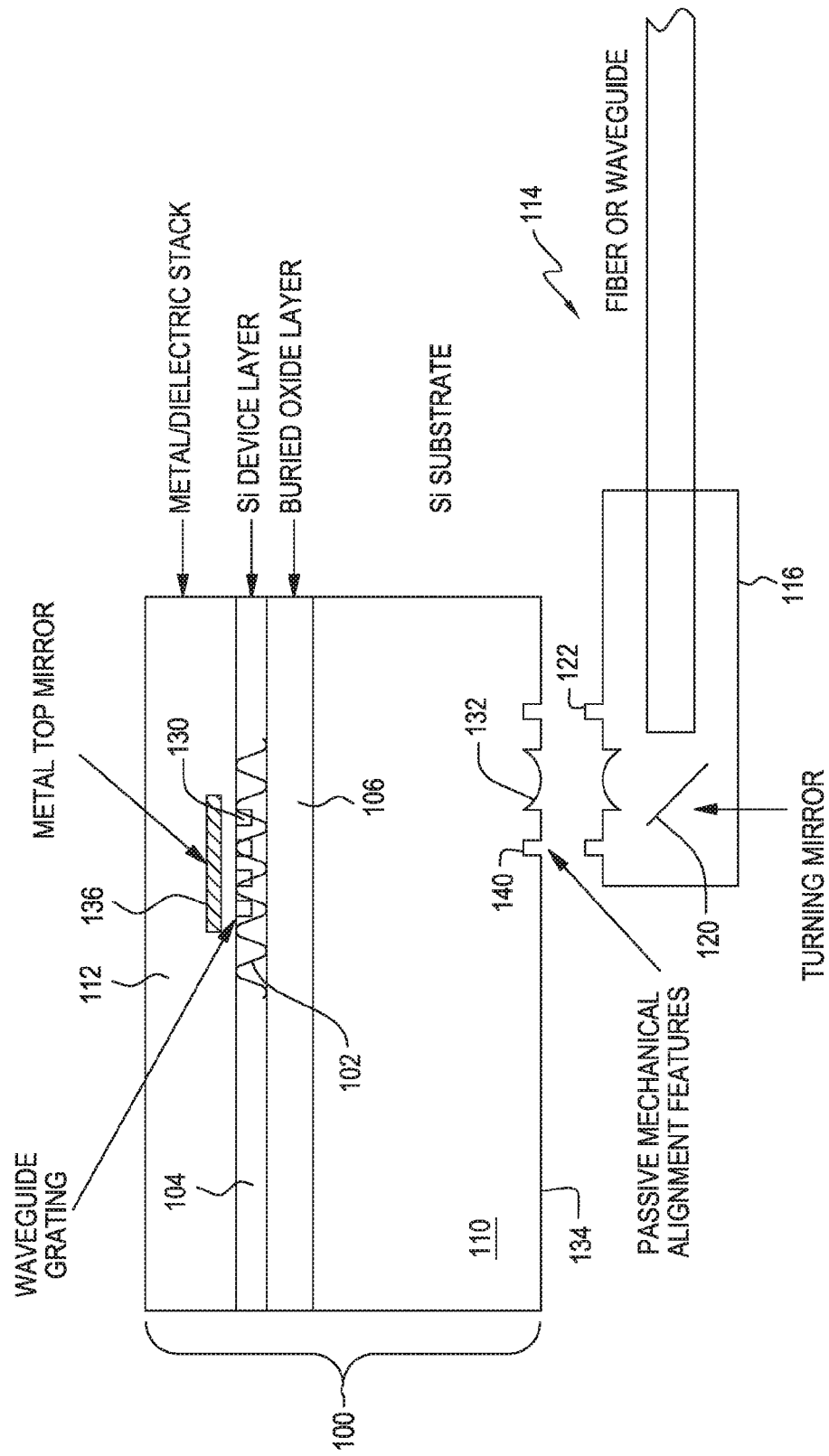
FIG. 1 is a cross-section of an optoelectronic integrated circuit according to an embodiment of the invention.

FIG. 1 is a cross-section of an optical coupling structure in accordance with an embodiment of the invention. This embodiment employs a silicon-on-insulator (SOI) wafer 100 (although other high-index-contrast material such as InP, SiN, etc. may be used) in which optical waveguides, represented at 102, are patterned into the silicon device layer 104. Typical single-mode waveguides are 0.2 µm to 0.3 µm in height by 0.4 µm to 0.6 µm in width. A buried oxide layer 106, typically 1 to 3 µm thick, exists on the SOI wafer beneath the silicon device layer and above the silicon substrate layer 110, and a metal layer 112 exists above the device layer 104.

Both passive (e.g., wavelength-division multiplexers and demultiplexers, waveguide interconnects, power splitters and combiners, etc.) and active (e.g. modulators, detectors, switches, and phase shifters) components may be fabricated in the silicon device layer 104 together with electronic components used to interface the photonics and for other processing functions. FIG. 1 also shows an external fiber or waveguide 114 that includes a connector 116, a turning mirror 120 and one or more passive mechanical alignment elements 122.

In an embodiment, the substrate material for the photonic chip is Si; photonic circuits have been demonstrated to offer extremely high-density integration (nm-scale), CMOS and SiGe bipolar process compatibility, and low fabrication cost. Optical devices (modulators and detectors) have been demonstrated to operate at speeds up to 40 Gb/s and beyond. In addition, wavelength division multiplexing (WDM) can be straightforwardly incorporated into the Si photonic circuits, offering off-chip optical coupling of 10× to 100× more channels per fiber compared to parallel implementations. This feature takes full advantage of the integration capability of the Si photonic structures; because of their sub-micron dimensions, tens to hundreds of thousands of devices can be incorporated in a square centimeter, driving the need for dense, highly efficient, and broadband optical coupling schemes.

In the embodiment shown in FIG. 1, a grating 130 is patterned into the photonic waveguides 102 in the device layer 104 so as to allow near-normal light reflection up/down from the waveguide. The substrate 110 is used to enhance performance by focusing the light into/out of the grating couplers via refractive lenses 132 etched into or bonded onto the bottom 134 of the substrate layer (back side of the wafer). The addition of metal mirrors 136 disposed over the grating structure 130 is used to enhance efficiency by redirecting the upward traveling light back toward the grating and redirecting this light along the desired optical path.

In an embodiment, lens elements 132 are provided on the back surface 134 of the substrate 110 aligned on the optical path. An array of lenses are provided where each lens within the array corresponds to individual waveguide channels. The lens elements are designed to either collimate the output light from the photonic chip or to refocus the light into an external fiber or waveguide array. In the reverse path, the lens elements accept the light from the external fiber or waveguide array and focus the light onto the grating coupler which redirects the light into the photonic waveguides 102. An embodiment of the invention employs lens elements lithographically fabricated on the back side of the wafer. Furthermore, mechanical alignment features 140 can also be fabricated on the back surface 134 to facilitate passive alignment to the external fiber or waveguide array 114.

The external fiber or waveguide connector 116 contains an array of optical fibers or waveguides arranged approximately parallel to the photonic chip surface, and also includes turning mirrors 120 to redirect light normal to the surface and into the fiber array. The fiber connector may or may not include an array of lens elements, one for each fiber element. The connector housing 116 can be fabricated from low-cost injection-molded plastic or lithographically patterned using a semiconductor substrate, such as a Si optical bench.

The grating structure 130 may be implemented by etching sub-wavelength facets into a fraction of the full silicon layer thickness. For example, the etched areas may then be filled with dielectric material, such that a region of alternating silicon/dielectric facets results. Without further enhancements, the grating diffracts light in both the upward and downward directions in substantially equal amounts.

Several methods can be used to improve coupling efficiency in the backside (through substrate direction). For example, the mirror 136 may be disposed at a distance of a half-wavelength above the grating 130, where the wavelength includes the effect of the index of refraction of the dielectric layer between the grating and the mirror. Alternatively, the mirror 136 may be composed of a dielectric stack of alternating low-index and high-index layers.

Another method of enhancing the efficiency is to blaze the grating 130, which is to pattern the facets of the silicon grating such that the orientation of these facets provides substantial reflection in the backside (through substrate) direction.

An alternate method to reduce the unwanted upward diffracted light is to dispose optically absorbing layers above the grating feature. This method does not improve efficiency, but will reduce unwanted scattered light which may result in optical crosstalk.

The above discussion describes coupling from the waveguide and output at the back (substrate) side of the chip. The discussed methods also provide similar efficiency enhancements in the reverse direction—that is, input from the back of the chip and output into the silicon waveguide.

Figure 2:
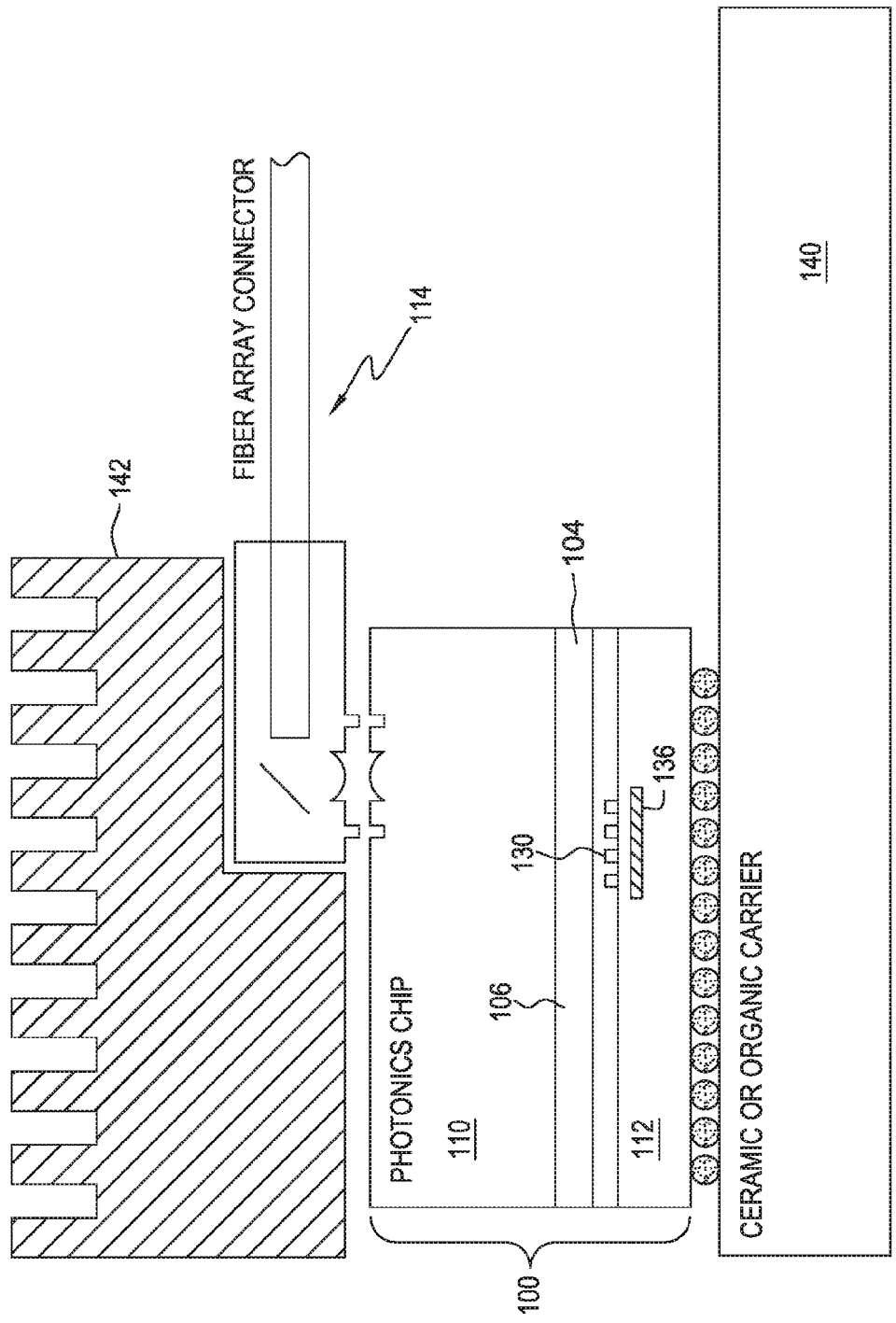
FIG. 2 shows the optoelectronic integrated circuit of FIG. 1 in a packaged photonic optical transceiver.

An example of a fully packaged optical transceiver module, in accordance with an embodiment of this invention, is depicted in FIG. 2. The photonic chip 100 is flip-chip attached to an organic or ceramic package 140. The fiber (or waveguide) connector 116 is assembled onto the back surface 134 using passive alignment features, for example as discussed above. A heat spreader 142 is also attached to the back surface of the photonic chip. The heat spreader also includes mechanical features to accommodate the fiber array connector.

Figure 3:
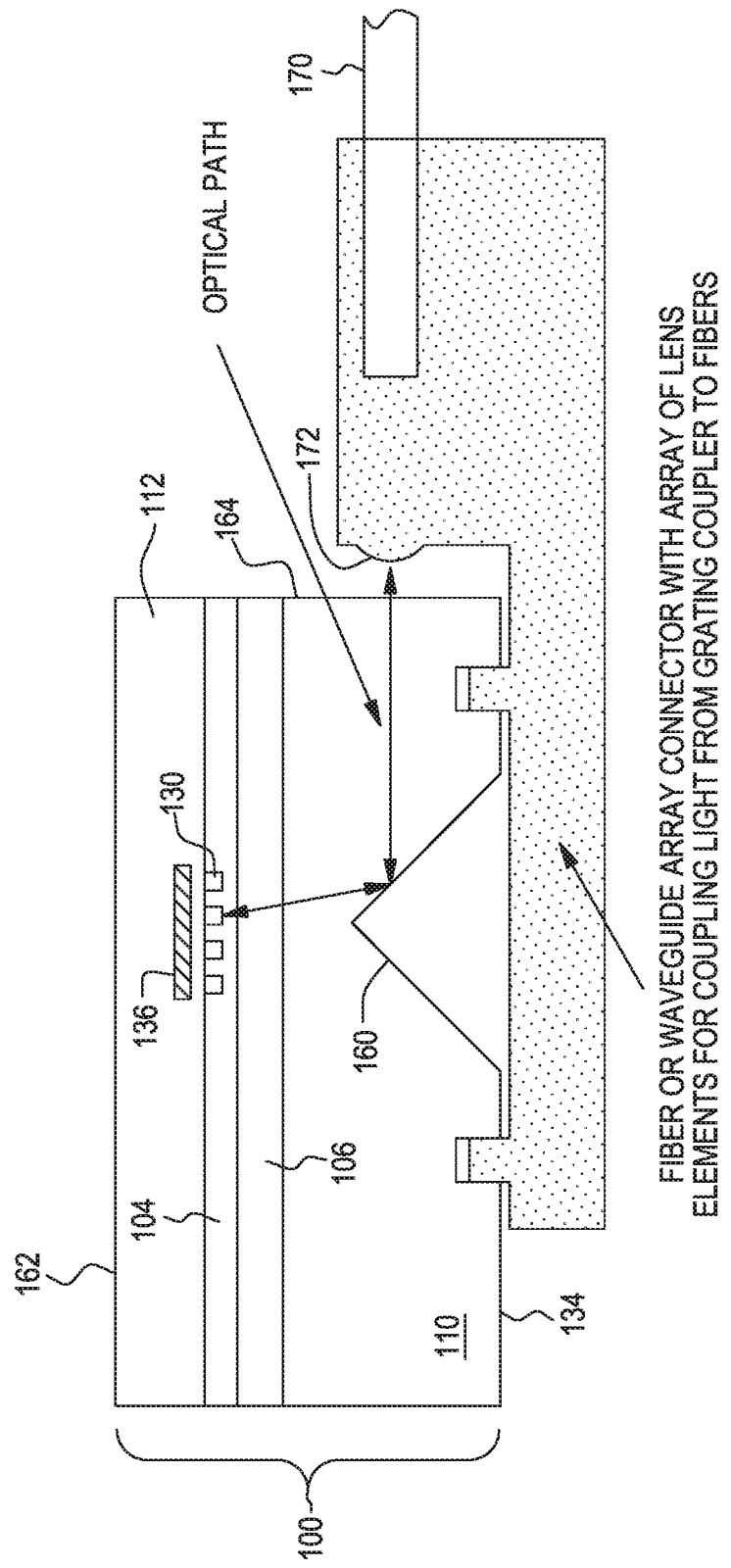
FIG. 3 illustrates an alternate embodiment of the invention, in which a V-shaped groove is formed in a surface of the photonic chip.

FIG. 3 illustrates an alternate embodiment. In this embodiment, one or more V-grooves 160 are fabricated into the rear or second surface 134 of the photonic chip and used to reflect light from the diffractive coupling elements into the substrate in a direction nearly parallel with the first and second surfaces 162, 134 of the chip to an edge 164 of the chip. This edge of the chip may be made optically smooth by a cleaving, polishing or etching step.

An external fiber or waveguide 170 may be secured to the photonic chip at or adjacent to edge 164 to receive the light reflected by groove 160. This external fiber or waveguide 170 may also be used to direct light into the chip 100, toward groove 160, which reflects this light toward grating 130. As represented at 172, one or more lenses may be disposed at or adjacent the end of fiber or waveguide 170 to focus light into or transmitted from the fiber or waveguide.

FIGS. 4-11 show additional alternate embodiments. With the embodiment shown in FIG. 4, the external fiber or waveguide 202 is aligned with the direction of the light reflected by the waveguide grating 130. In this embodiment, optical coupling is performed via the waveguide grating coupler using a refractive substrate with lensed 204 bottom face 134.

Figure 4:
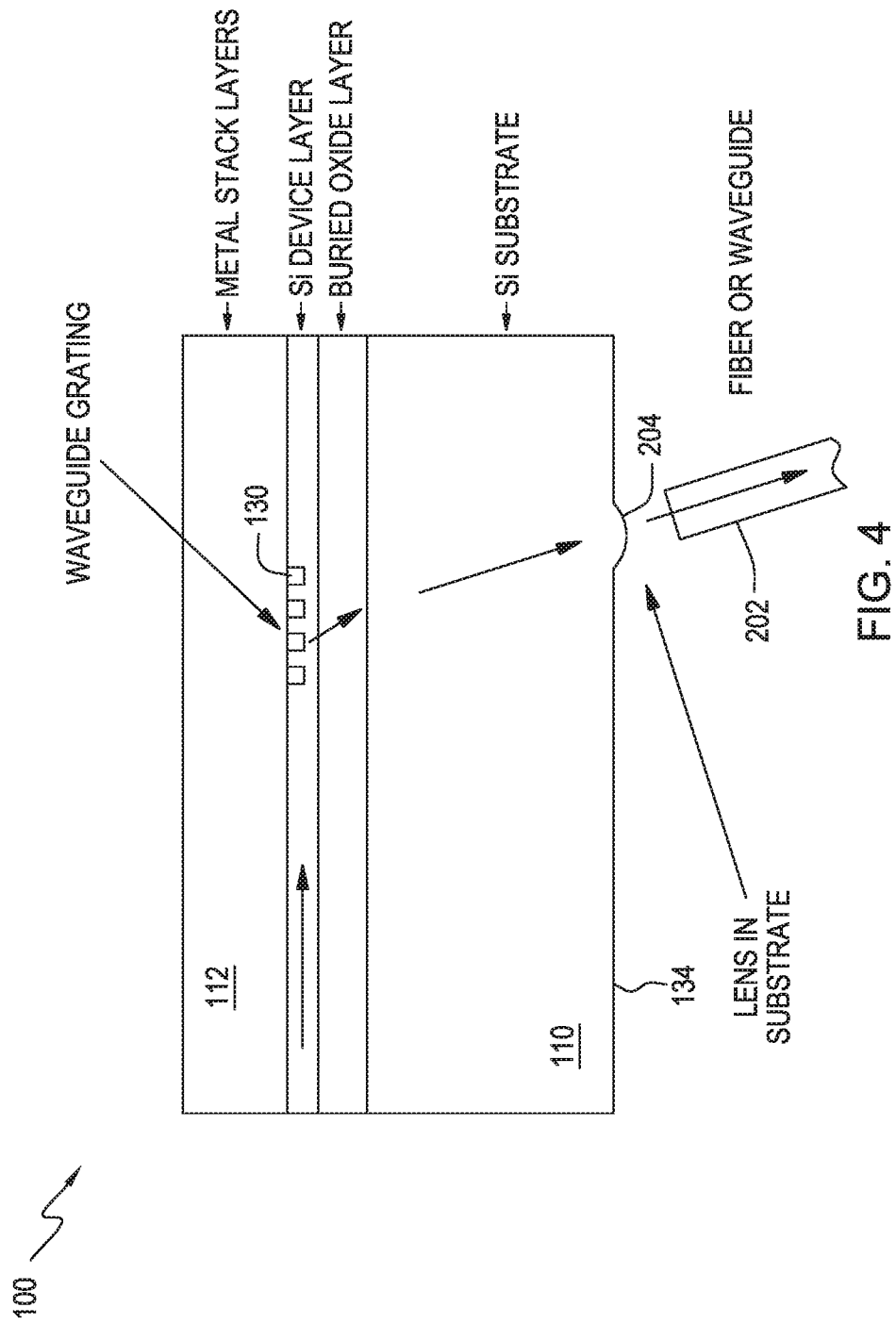
FIG. 4 shows an embodiment of the invention in which an external waveguide or fiber is aligned with the direction of the light reflected by the waveguide grating.
Figure 5:
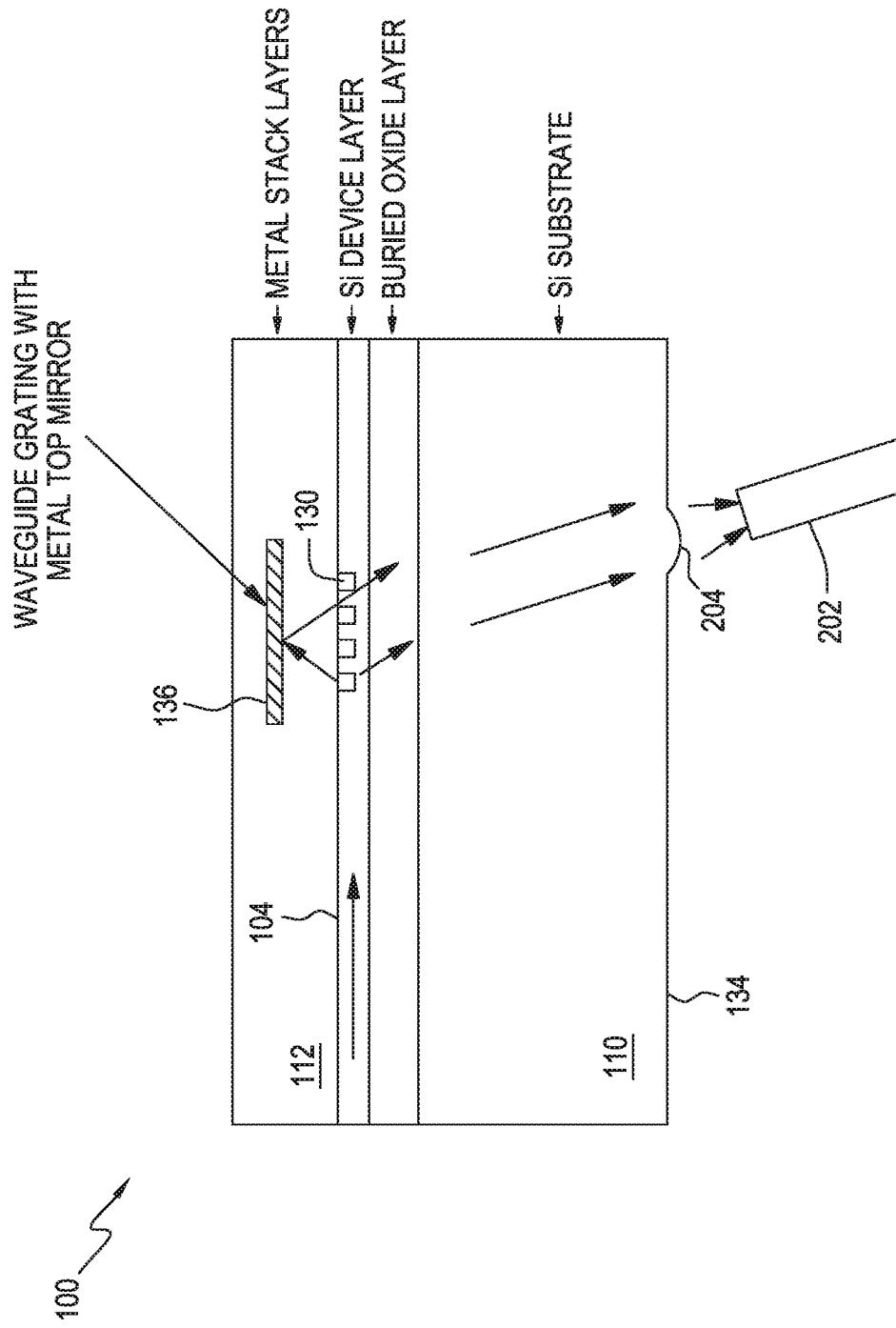
FIG. 5 illustrates the use of a metallic mirror in the embodiment of FIG. 4.

With the embodiment illustrated in FIG. 5, optical coupling is enhanced through top mirror 136 in the metal stack 112. Optical coupling, as in the embodiment of FIG. 4, is performed via the waveguide grating coupler 130 using a refractive substrate with lensed 204 bottom face. This embodiment may also include a polarization diversity scheme via polarization-splitting waveguide grating and mode-matching to various fiber dimensions.

Figure 6:
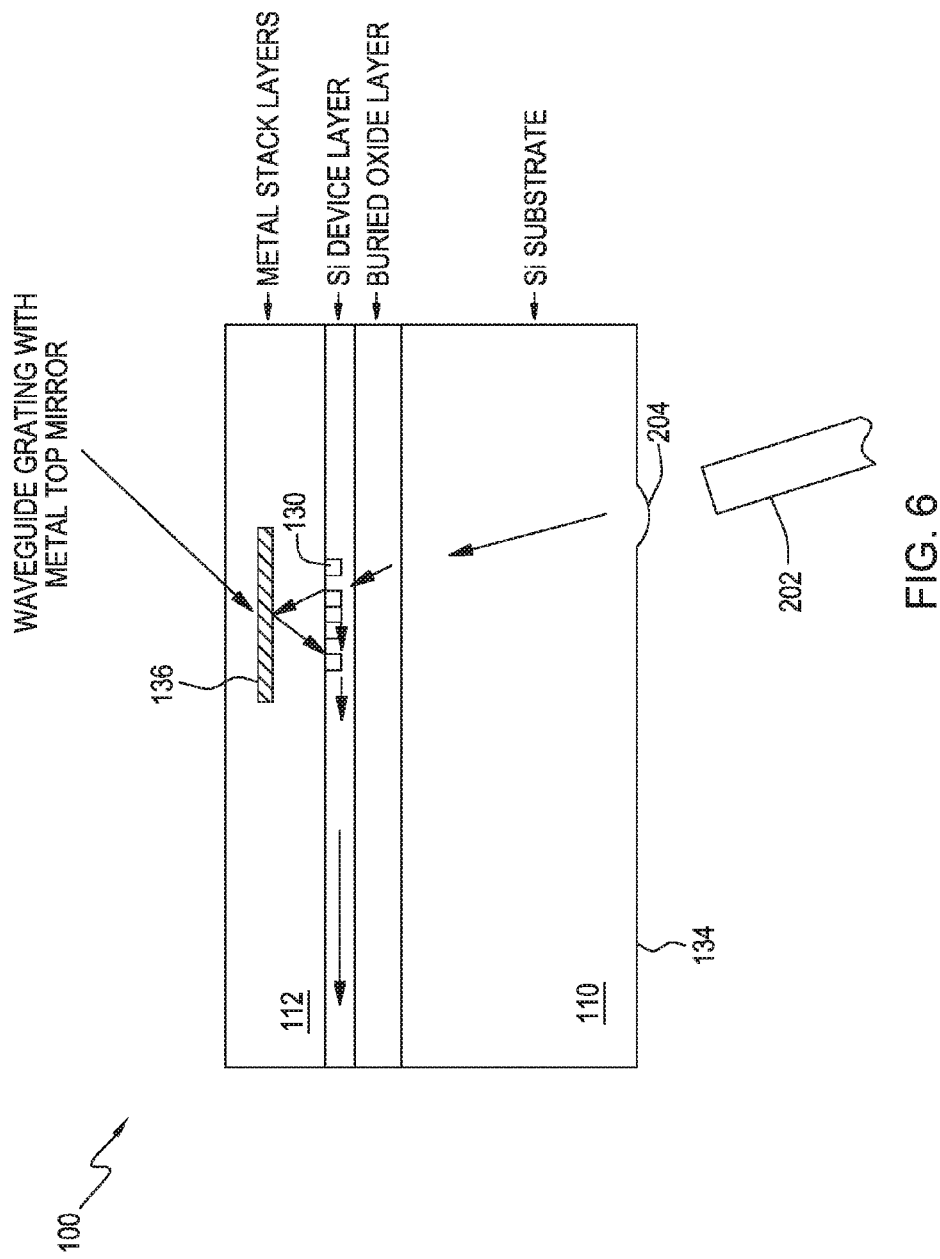
FIG. 6 illustrates that the optical coupling in embodiment of the invention is bidirectional.

FIG. 6 illustrates that the optical coupling is bidirectional—light may be transmitted from, as well as directed to, the external optical waveguide 202. It may be noted, here too, that the embodiment may include a polarization diversity scheme via polarization splitting waveguide grating and mode-matching to various fiber dimensions.

Figure 7:
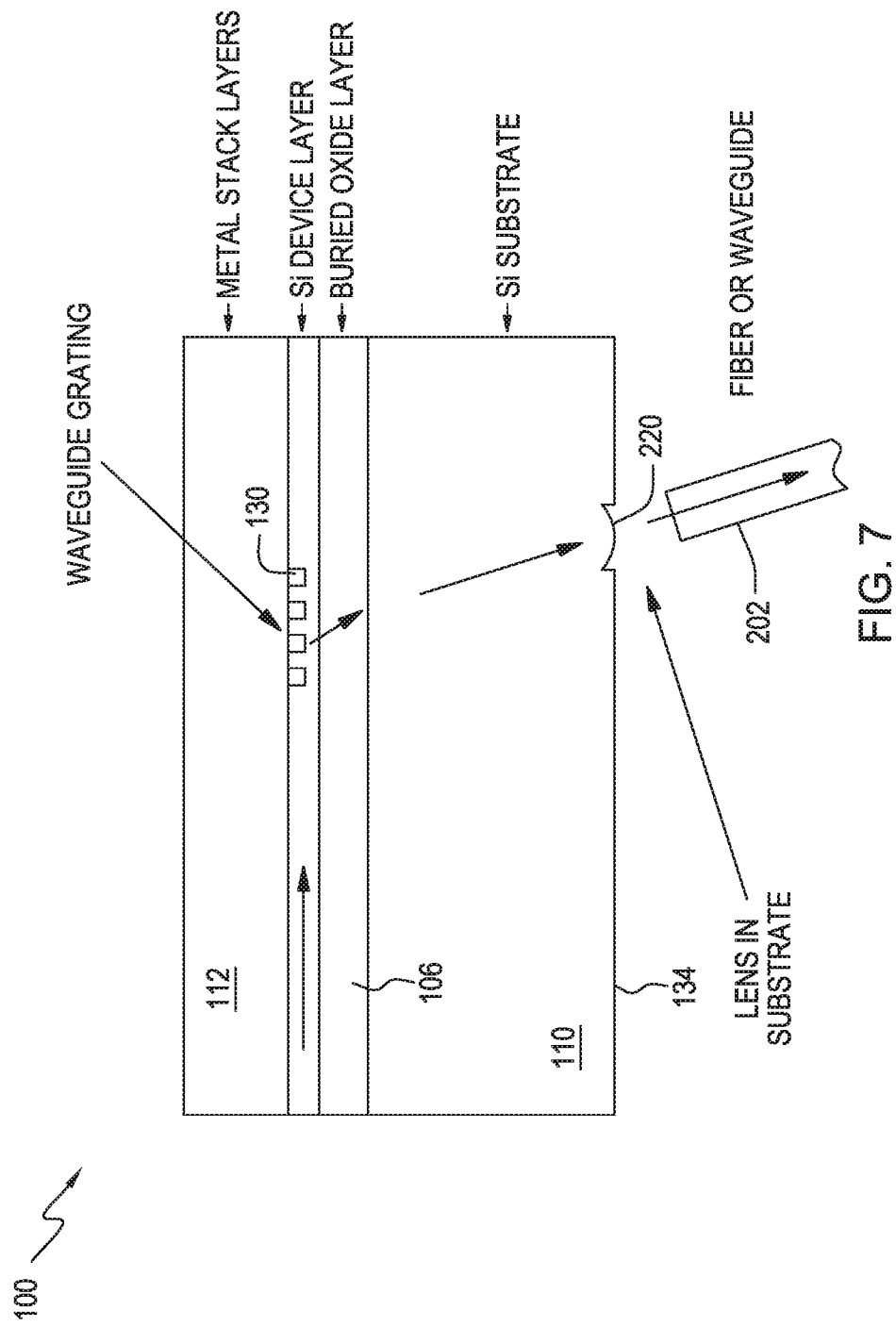
FIG. 7 shows an embodiment in which lenses are formed in the bottom surface of the substrate of the photonic chip.

FIG. 7 shows an embodiment in which the lens 220 on the substrate 110 is formed in the substrate so that the lens does not project beyond the surface 134 of the substrate.

Figure 8:
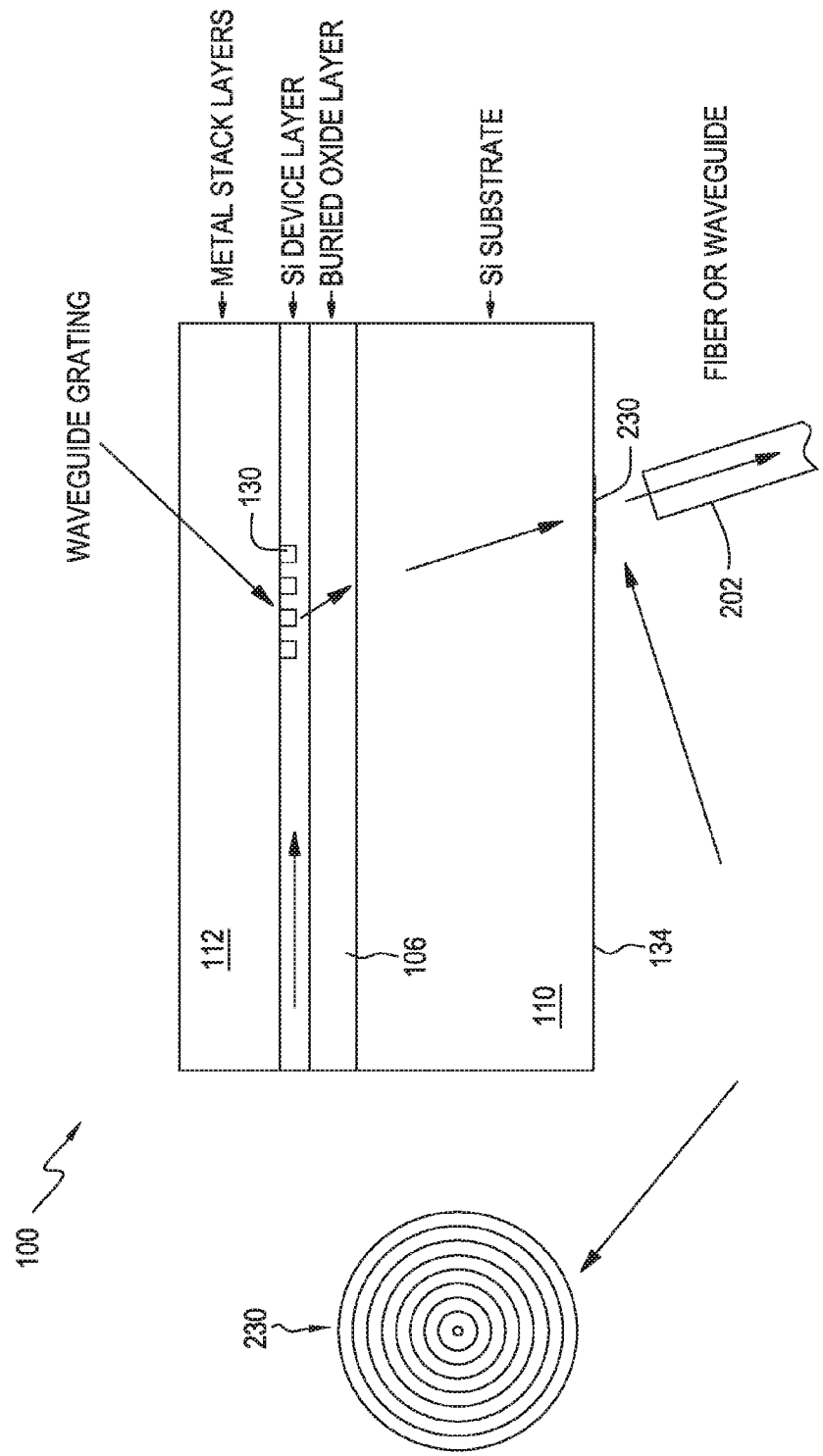
FIG. 8 illustrates that the lens on the bottom surface of the chip may be comprised of a series of concentric rings.

As illustrated in FIG. 8, the lens 230 on the bottom surface 134 of the substrate 110 may be comprised of a series of concentric rings.

Figure 9:
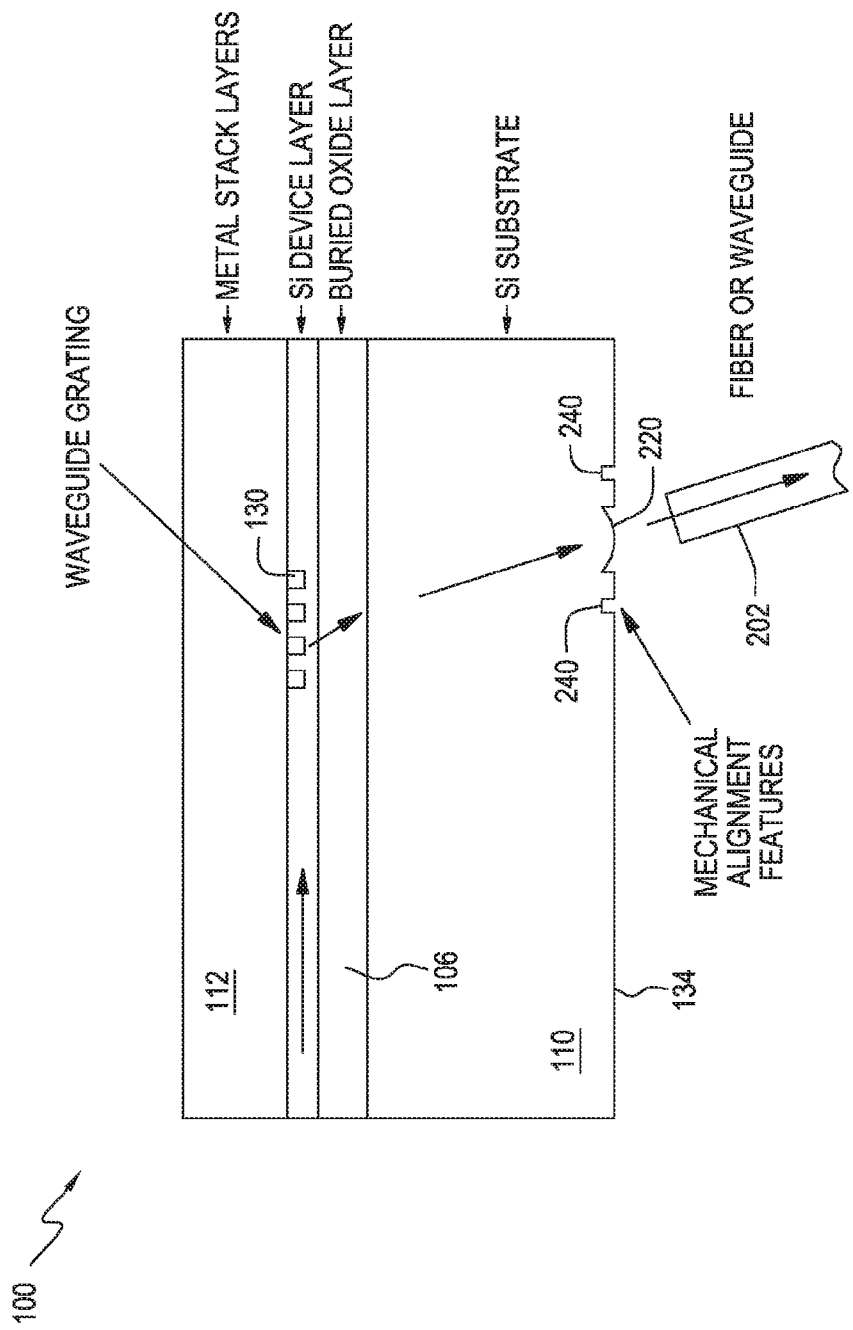
FIG. 9 shows an embodiment in which mechanical alignment features are formed on the substrate of the photonic chip.

FIG. 9 shows an embodiment in which mechanical alignment features 240 are formed on substrate 110, around or adjacent lens 220.

Figure 10:
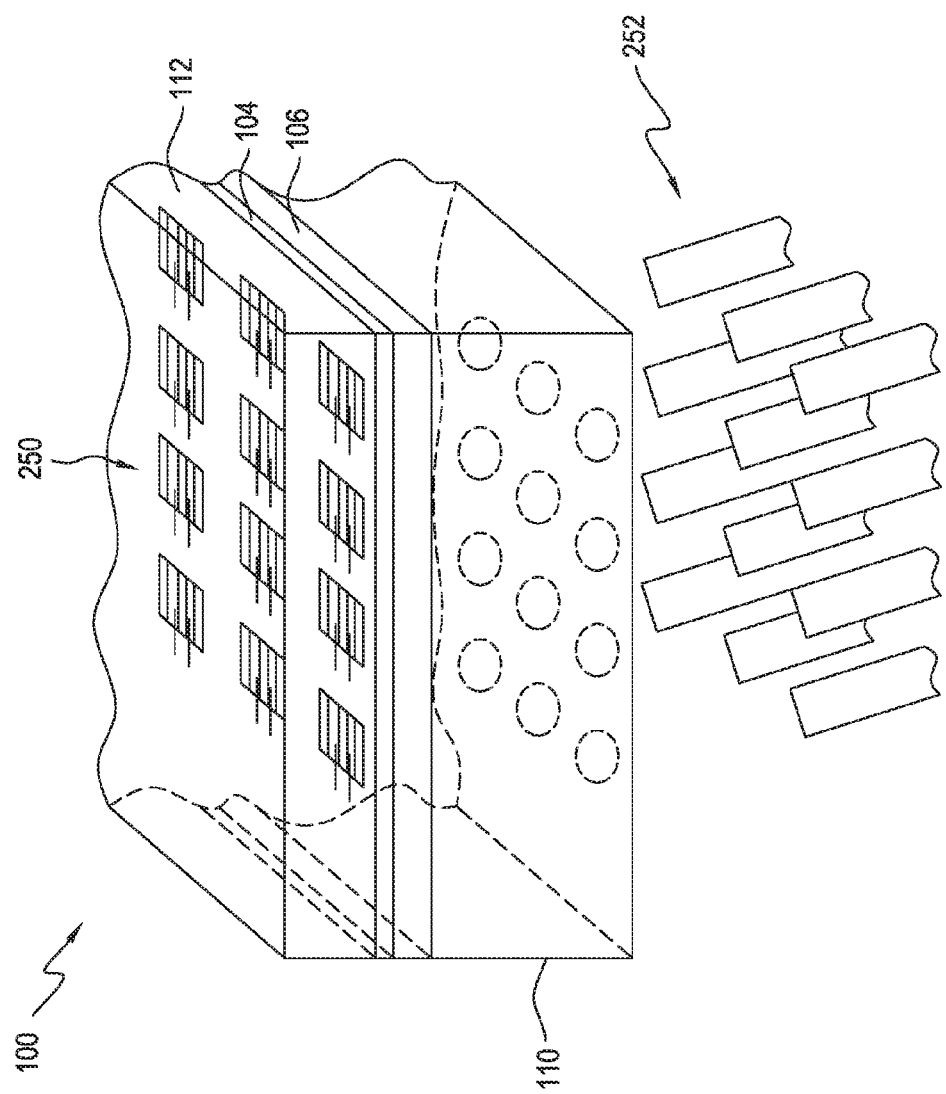
FIG. 10 illustrates a photonic chip having a series of waveguide gratings, and shows a series of external waveguides or fibers adjacent a bottom surface of the chip.

FIG. 10 illustrates a photonic chip having a series of waveguide gratings 250, and a series of external waveguides or fibers 252. Each of the waveguides or fibers 252 is associated with one of the waveguide gratings 250 and may be used to direct light to or receive light from that one grating.

Figure 11:
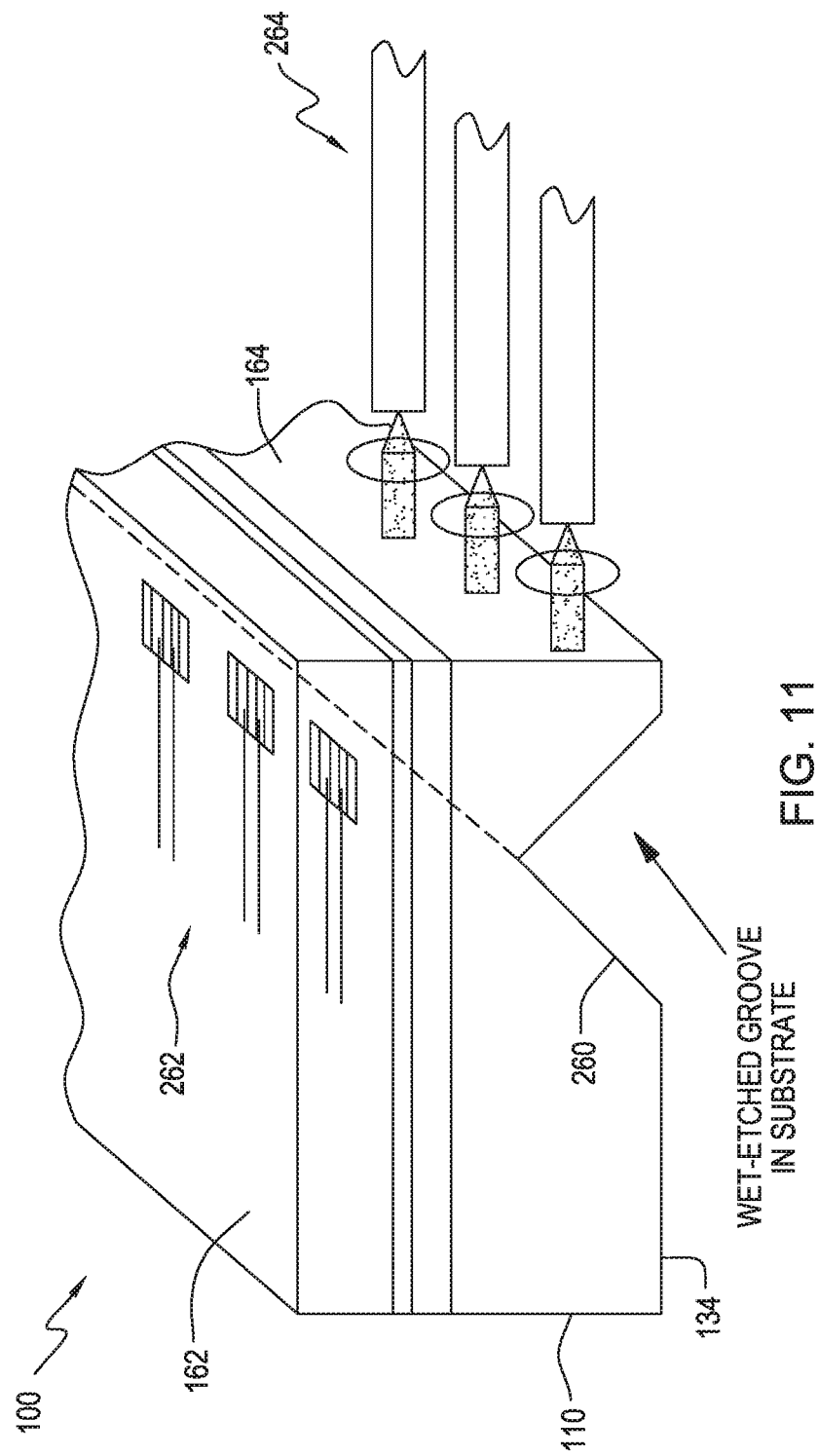
FIG. 11 shows a photonic chip having a series of waveguide gratings, and shows a series of external waveguides or fibers adjacent a lateral edge of the chip.

FIG. 11 shows a photonic chip having a V-shaped groove 260, similar to the groove 160 of FIG. 3, formed in substrate 110 of the chip. As shown in FIG. 11, this photonic chip also includes a series of waveguide gratings 262, and a series of external waveguides or fibers 264 are associated with these gratings. These external waveguides or fibers are located adjacent a lateral edge 164 of the chip, between surfaces 162, 134. Each of these external waveguides or fibers 264 are associated with one of the waveguide gratings and may be used to direct light to or receive light from that grating.

While it is apparent that the invention herein disclosed is well calculated to achieve the features discussed above, it will be appreciated that numerous modifications and embodiments may be devised by those skilled in the art, and it is intended that the appended claims cover all such modifications and embodiments as fall within the true spirit and scope of the present invention.

The invention claimed is:

1. An optoelectronic integrated circuit for coupling light to an external optical fiber or waveguide, comprising:
   a semiconductor body including first and second opposite and parallel external surfaces, and further including a metal-dielectric stack, an optical device layer, a buried oxide layer and a semiconductor substrate arranged in series between said first and second surfaces, with the optical device layer between the semiconductor substrate and the first surface of the semiconductor body;
   at least one optical waveguide formed in the optical device layer for guiding light in a defined plane in the optical device layer; and
   a grating patterned into the optical device layer and comprising alternating silicon and dielectric facets to couple light from the waveguide, through the buried oxide layer and through the substrate, to the second external surface of the semiconductor body, opposite the first external surface thereof, at a near-normal angle to said defined plane to couple the light from the waveguide to an external optical fiber or waveguide.

2. The optoelectronic integrated circuit according to claim 1, wherein said facets are etched into the optical device layer.

3. The optoelectronic integrated circuit according to claim 2, wherein the grating includes a plurality of etched areas in the optical device layer.

4. The optoelectronic integrated circuit according to claim 3, wherein the etched areas are filled with a dielectric material.

5. The optoelectronic integrated circuit according to claim 3, wherein the etched areas are formed in a top surface of the optical device layer.

6. The optoelectronic integrated circuit according to claim 1, wherein the grating reflects light in upward and downward directions in substantially equal amounts.

7. The optoelectronic integrated circuit according to claim 1, wherein the grating includes a multitude of spaced apart etched areas immediately below the metal-dielectric stack.

8. The optoelectronic integrated circuit according to claim 1, further comprising an array of lenses formed in the second surface of the semiconductor body to receive light from or to transmit light to the grating.

9. The optoelectronic integrated circuit according to claim 8, further comprising one or more mechanical elements fabricated on the second surface of the semiconductor body to facilitate positioning an external optical fiber or optical waveguide on the semiconductor body in a position aligned with the array of lenses.

10. The optoelectronic integrated circuit according to claim 1, further comprising a metallic reflective layer formed in said metal-dielectric stack adjacent the grating to redirect light to the grating and therein enhance optical coupling efficiency.

11. A method of fabricating an optoelectronic integrated circuit for coupling light to an external optical fiber or waveguide, comprising:
   fabricating a semiconductor body including first and second and parallel opposite external surfaces, and further including a metal-dielectric stack, an optical device layer, a buried oxide layer and a semiconductor substrate arranged in series between said first and second surfaces, with the optical device layer between the semiconductor substrate and the first surface of the semiconductor body, including
   forming at least one optical waveguide in the optical device layer for guiding light in a defined plane in the optical device layer, and
   patterning a diffractive grating in the optical device layer and comprised of alternating silicon and dielectric facets to couple light from the waveguide, through the buried oxide layer and through the substrate, to the second external surface of the semiconductor body, opposite the first external surface thereof, at a near-normal angle to said defined plane to couple the light from the waveguide to an external optical fiber or waveguide.

12. The method according to claim 11, wherein the patterning a diffractive grating in the optical device layer includes etching said facets into the optical device layer.

13. The method according to claim 12, wherein the patterning a diffractive grating in the optical device layer include etching a plurality of areas into the optical device layer.

14. The method according to claim 13, wherein patterning a diffractive grating in the optical device layer further includes filing said etched areas with a dielectric material.

15. The method according to claim 13, wherein the etching a plurality of areas into the optical device layer includes forming the etched areas in a top surface of the optical device layer.

16. An optoelectronic integrated circuit for coupling light to an external optical fiber or waveguide, comprising:
   a semiconductor body including first and second opposite and parallel external surfaces, and further including a metal-dielectric stack, an optical device layer, a buried oxide layer and a semiconductor substrate arranged in series between said first and second surfaces, with the optical device layer between the semiconductor substrate and the first surface of the semiconductor body;
   at least one optical waveguide formed in the optical device layer for guiding light in a defined plane in the optical device layer;
   a grating patterned into the optical device layer and comprising alternating silicon and dielectric facets to couple light from the waveguide, through the buried oxide layer and through the substrate, to the second external surface of the semiconductor body, opposite the first external surface thereof, at a near-normal angle to said defined plane; and
   one or more grooves formed in the second external surface of the semiconductor body to reflect light from the diffractive coupling elements into a direction substantially parallel with the first and second surfaces of the semiconductor body to an edge of the semiconductor body to couple the light from the waveguide to an external optical fiber or waveguide.

17. The optoelectronic integrated circuit according to claim 16, wherein the grating reflects light in upward and downward directions in substantially equal amounts.

18. The optoelectronic integrated circuit according to claim 16, wherein the grating includes a multitude of spaced apart etched areas immediately below the metal-dielectric stack.

19. The optoelectronic integrated circuit according to claim 16, further comprising an array of lenses formed in the second surface of the semiconductor body to receive light from or to transmit light to the grating.

20. The optoelectronic integrated circuit according to claim 19, further comprising one or more mechanical elements fabricated on the second surface of the semiconductor body to facilitate positioning an external optical fiber or optical waveguide on the semiconductor body in a position aligned with the array of lenses.

* * * * *